(12) United States Patent
Desai et al.

(10) Patent No.: US 8,594,310 B2
(45) Date of Patent: Nov. 26, 2013

(54) INTELLIGENT CALL TRANSFER BETWEEN CALL CENTERS

(75) Inventors: Prashant B. Desai, Land O Lakes, FL (US); Juan Vasquez, Tampa, FL (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 291 days.

(21) Appl. No.: 12/963,852

(22) Filed: Dec. 9, 2010

(65) Prior Publication Data

US 2012/0148040 A1    Jun. 14, 2012

(51) Int. Cl.
*H04M 3/00* (2006.01)
*C23C 16/50* (2006.01)
*C23C 16/00* (2006.01)

(52) U.S. Cl.
CPC .............. *C23C 16/50* (2013.01); *C23C 16/00* (2013.01)
USPC ............. 379/266.03; 379/265.12; 379/266.04

(58) Field of Classification Search
USPC ............... 379/265.01, 265.02, 265.09, 265.1, 379/265.11, 265.12, 265.14, 266.01, 379/266.03, 266.04, 266.1
See application file for complete search history.

(56) References Cited

U.S. PATENT DOCUMENTS

2004/0148332 A1* 7/2004 Parolkar et al. ............... 709/200
2007/0064912 A1* 3/2007 Kagan et al. ............... 379/265.1
2009/0214020 A1* 8/2009 Evanchik et al. ......... 379/265.06

\* cited by examiner

*Primary Examiner* — Antim Shah (57) ABSTRACT

A method may include receiving, at a first call center, a call from a caller, forwarding the call to an agent workstation and determining that the call must be transferred. The method may also include providing, at the agent workstation, a user interface identifying a number of items associated with possible reasons for the call and receiving, via the user interface, input selecting one of the items. The method may further include appending information to the call based on the received input and forwarding the call with the appended information to a network device associated with a number of call centers.

16 Claims, 7 Drawing Sheets

INTELLIGENT CALL TRANSFER BETWEEN CALL CENTERS

BACKGROUND INFORMATION

Companies often use call centers to address customer inquiries and/or resolve customer problems. Interactive voice response (IVR) systems are frequently used to initially interact with the caller to obtain information regarding the call. The call is then often transferred to a human agent to service the customer inquiry and provide the desired assistance.

Frequently, however, the call may have been originally received by a call center that is not capable of handling the customer call. The human agent must then interact with the caller, attempt to identify what the caller needs and then further attempt to identify an appropriate telephone number for the call center that can handle the call.

DETAILED DESCRIPTION OF PREFERRED EMBODIMENTS

The following detailed description refers to the accompanying drawings. The same reference numbers in different drawings may identify the same or similar elements. Also, the following detailed description does not limit the invention.

Implementations described herein relate to transferring calls from one call center to another call center. In one implementation, a device at the call center initially contacted to service a call provides an interface for allowing a call center agent to select an item identifying a reason for the call. The device at the call center may then append information associated with the reason for the call and forward the call to another device configured to identify the appropriate call center. The device receiving the forwarded call may then access the appended information identifying the reason for the call, identify the appropriate call center to service the call and transfer the call the appropriate call center.

Figure 1:
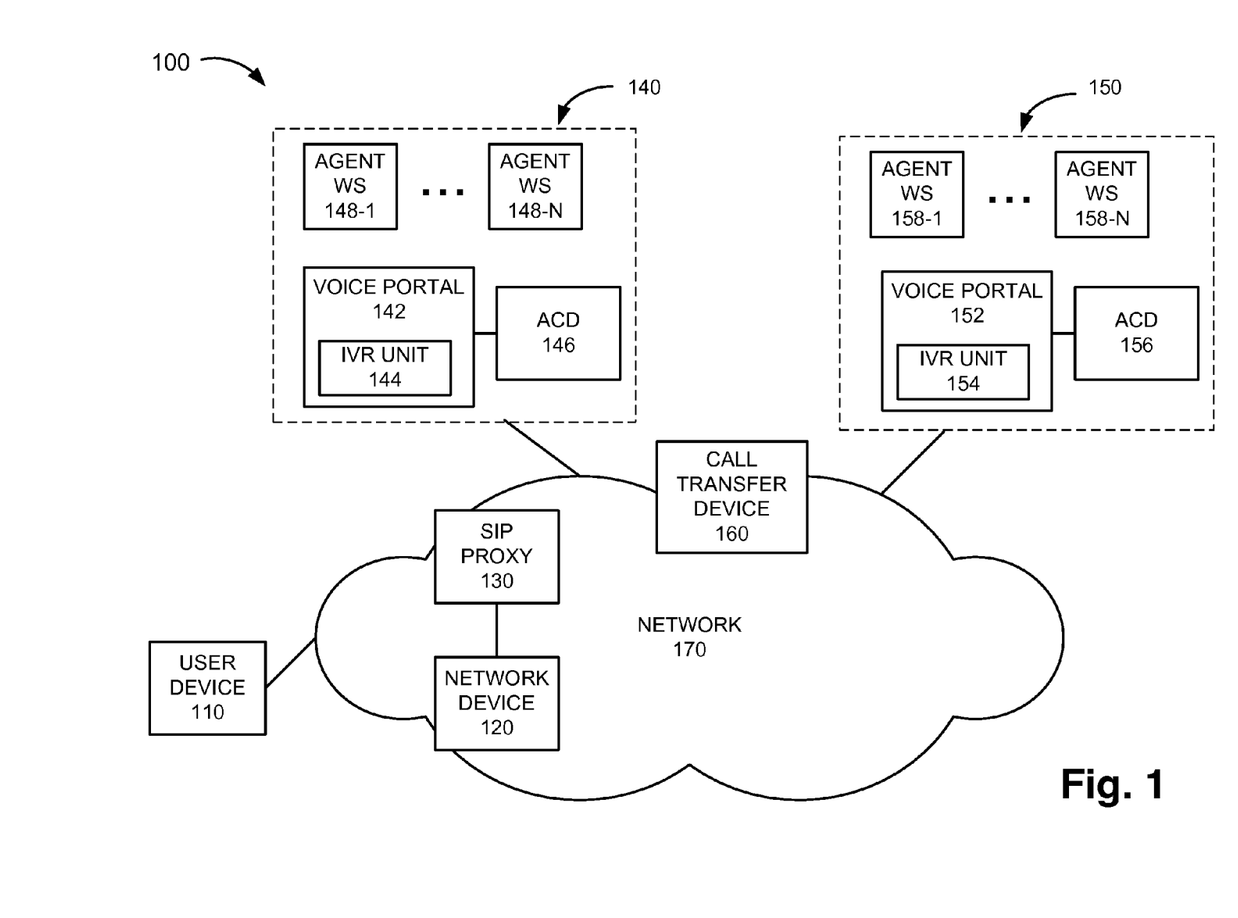
FIG. 1 illustrates an exemplary network in which systems and methods described herein may be implemented.

FIG. 1 is a block diagram of an exemplary network 100 in which systems and methods described herein may be implemented. Referring to FIG. 1, network 100 includes user device 110, network device 120, session initiation protocol (SIP) proxy 130, call centers 140 and 150, call transfer device 160 and network 170.

User device 110 may include any type of communication or computation device that is capable of transmitting and receiving voice signals and/or data to/from a network, such as network 170. For example, user device 110 may include any standard telephone, cordless telephone, cellular telephone, or other type of conventional telephone that interfaces with a public switched telephone network (PSTN) and/or wireless network to place and receive telephone calls. User device 110 may also include any client, such as a computer device, a web-based appliance, etc., that is configured to provide telephone functions using, for example, voice over Internet protocol (VoIP), H.323 protocol, etc. For example, user device 110 may include a SIP-based telephone device. In this case, the SIP-based telephone device may take the form of a standalone device, e.g., a SIP telephone designed and configured to function and appear like a conventional telephone. A SIP-based telephone device may also include a software client that may run, for example, on a conventional personal computer (PC), laptop computer or other computing device.

Network device 120 may include one or more devices, such as a gateway, that allow divergent transport networks to communicate and cooperatively carry traffic. For example, network device 120 may include a gateway that provides for interoperation at two levels, e.g., between different signaling schemes and between different media forms. As an example, network device 120 may adapt between SS7 signaling of network 170 and session initiation protocol (SIP), H.323 protocols or other protocols (e.g., Internet protocols (IPs) or Internet based protocols) used by other devices in network 100. In one implementation, network device 120 may convert time division multiplexed (TDM) encoded voice signals to a packetized data stream suitable for transport to and processing by a proxy device, such as SIP proxy 130.

Network device 120 may also include one or more session border controllers (SBCs) that provide control of the boundary between different service provider networks, provide signaling protocol inter-working between an IP-based network and other service provider networks, control the transport boundary between service provider networks, and provide usage metering and Quality of Service (QoS) measurements for media flows. In one implementation, network device 120 may correspond to an ingress point to SIP proxy 130. For example, network device 120 may receive a VoIP call from user device 110 and forward the VoIP call to SIP proxy 130.

SIP proxy 130 may include a server/computing device that is able to receive data from network device 120 and forward the received data to an appropriate voice portal, such as voice portal 142 or 152 using SIP protocol. In other implementations, SIP proxy 130 may be able to receive and forward data via another protocol, such as H.323.

Call center 140 may represent a call center configured to receive and handle a large volume of calls. Call center 140 may include voice portal 142, automatic call distributor 146, agent workstations (WSs) 148-1 through 148-N (referred to collectively as agent WSs 148 or individually as agent WS 148). Voice portal 142 may represent a front end device associated with call center 140. In an exemplary implementation, voice portal 142 may include interactive voice response (IVR) unit 144 that interacts with callers to obtain information associated with the call. For example, IVR unit 144 may include speech software/hardware that provides voice commands to a caller to obtain information. IVR unit 144 may also include speech recognition hardware/software that receives voice responses from the caller and identifies what the caller has voiced. If necessary (e.g., the call cannot be handled without human intervention), voice portal 142 may forward the call to an appropriate agent WS, such as one of agent WSs 148. Voice portal 142 may also interface with automatic call distributor (ACD).

ACD 146 may distribute calls received at voice portal 142 to one of agent WSs 148-1 through 148-N. ACD 146 is illustrated as being located externally from voice portal 142. In some implementations, ACD 146 may be part of voice portal 142. In each case, ACD 146 may forward calls to an available one of the agent WSs 148.

Agent WSs 148 may represent any conventional workstation/computer and operator used to handle calls from callers that require human intervention. In an exemplary implementation, agent WSs 148 may be associated with voice portal 142 and ACD 146. In addition, in an exemplary implementation, agent WSs 148 may be connected to ACD 146 and/or voice portal 142 via a network, such as network 170. In alternative implementations, agent WSs 148 may be connected directly to ACD 146 and/or voice portal 142, connected via a LAN, connected via a private network, etc.

Agent WSs 148 may include a workstation or computer, such as a personal computer or laptop. Agent WSs 148 may also include any device capable of performing IP based messaging, such as VoIP, to transmit voice and/or text. Agent WSs 148 may also include any conventional telephone device (not shown) to place and receive telephone calls. For example, the telephone device may be a standard telephone, a cordless telephone, a cellular telephone or any other type of conventional telephone. The telephone device may also include any type of device that is capable of transmitting and receiving voice signals to/from a data network. For example, the telephone device may include any client, such as a computer device, a web-based appliance, etc., that is configured to provide telephone functions. The telephone device may, for example, be a SIP-based telephone device. In this case, the SIP-based telephone device may take the form of a standalone device, e.g., a SIP telephone designed and configured to function and appear like a conventional telephone. A SIP-based telephone device may also include a software client that may run, for example, on a conventional PC, laptop computer or other computing device. In some implementations, agent WSs 148 may include speech recognition hardware/software that receives voice responses from a caller and identifies what the caller has voiced.

Call center 150 may represent another call center designed to receive and handle calls. For example, call center 140 and call center 150 may be associated with the same business entity, but may be designated for handling different types of calls/inquiries. As an example, call center 140 may be designated for handling customer orders and call center 150 may be designated for resolving customer problems. Referring to FIG. 1, call center 150 may include voice portal 152, IVR unit 154, automatic call distributor 156 and agent workstations (WSs) 158-1 through 158-N (referred to collectively as agent WSs 158 or individually as agent WS 158). Voice portal 152, IVR unit 154, ACD 156 and agent WSs 158 may be configured to operate in a similar manner as voice portal 142, IVR unit 144, ACD 146 and agent WSs 148, as described above with respect to call center 140.

Call transfer device 160 may include an intelligent routing device that is configured to receive communications from call center 140 and 150 for calls that cannot be serviced by the receiving call center. For example, call transfer device 160 may receive a communication forwarded from one of agent workstations 148 for a call that was not able to be serviced by call center 140. Call transfer device 160 may identify information (e.g., SIP header information) included in the communication from the call center, access one or more lookup tables and identify the appropriate call center to which the call will be forwarded, as described in more detail below.

Network 170 may include one or more wired, wireless and/or optical networks that are capable of receiving and transmitting data and voice signals. For example, network 170 may include one or more public switched telephone networks (PSTNs) or other type of switched network. Network 170 may also include one or more wireless networks and may include a number of transmission towers for receiving wireless signals and forwarding the wireless signals toward the intended destination. Network 170 may further include one or more satellite networks, one or more packet switched networks, such as an Internet protocol (IP) based network, a local area network (LAN), a wide area network (WAN), an intranet, the Internet, or another type of network that is capable of transmitting telecommunications traffic (e.g., VoIP traffic). For example, network 170 may include one or more SIP-based networks, one or more H.323/H.225-based networks, or any other type of packet switched network that is capable of transmitting traffic from a source device to a destination device.

The exemplary configuration illustrated in FIG. 1 is provided for simplicity. It should be understood that a typical network may include more or fewer devices than illustrated in FIG. 1. For example, one user device 110, one network device 120, one SIP proxy 130, two call centers 140 and 150, one call transfer device 160 and one network 170 are shown for simplicity. It should be understood that network 100 may include a large number (e.g., hundreds or thousands) of user devices, work stations, a number of other networks and/or voice portals. As an example, in one implementation, each of call centers 140 and 150 may include hundreds of agent WSs and multiple ACDs. In addition, additional switching devices, routing devices, etc., involved in routing calls and data may be included in network 100.

Further, various functions are described as being performed by particular components in network 100. In other implementations, various functions described as being performed by one device may be performed by another device or various functions described as being performed by multiple devices may be combined and performed by a single device.

Figure 2:
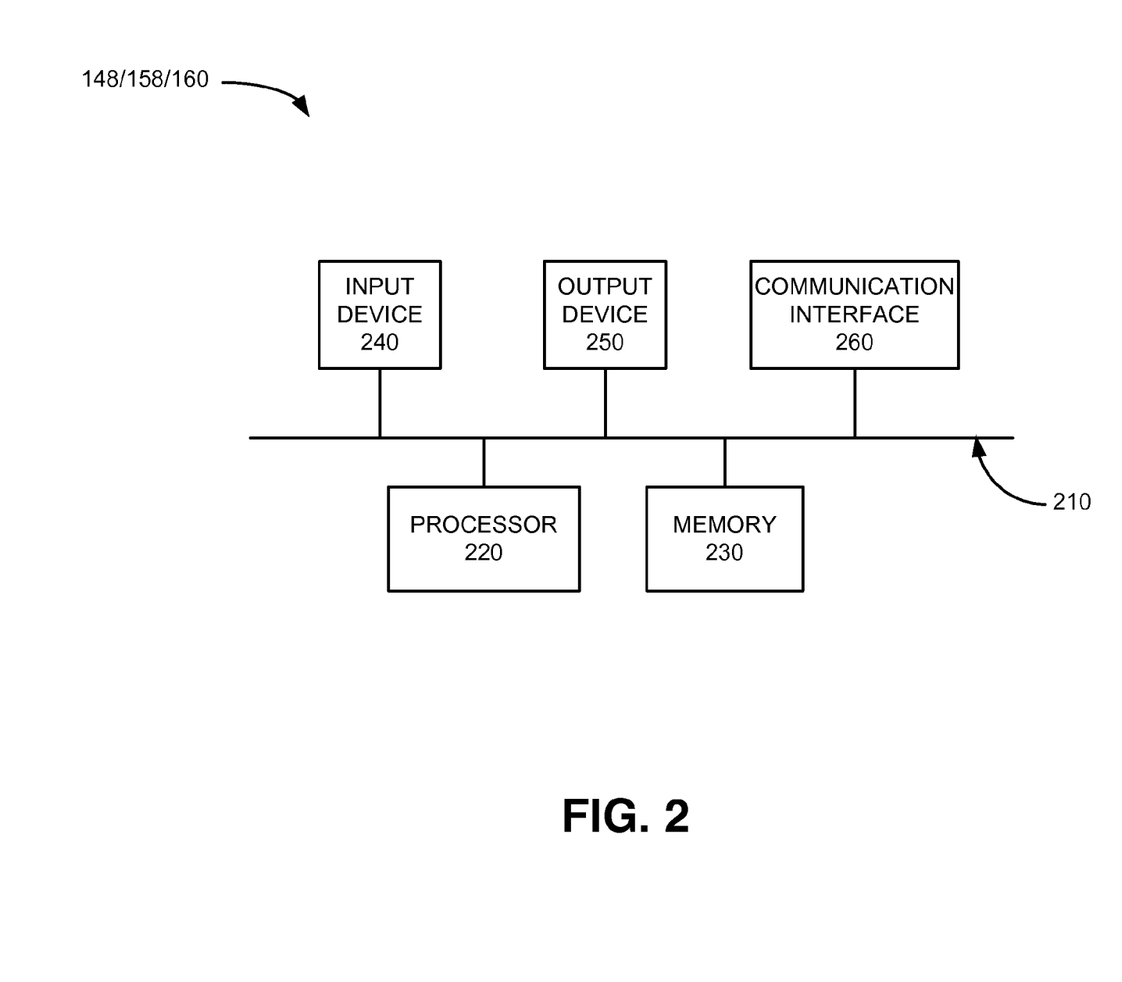
FIG. 2 illustrates an exemplary configuration of one or more of the components of FIG. 1.

FIG. 2 illustrates an exemplary configuration of agent WS 148. Other devices in network 100, such as agent WSs 158, voice portals 142 and 152, ACDs 146 and 156 and call transfer device 160 may be configured in a similar manner. Referring to FIG. 2, agent WS 148 may include bus 210, processor 220, memory 230, input device 240, output device 250 and communication interface 260. Bus 210 may include a path that permits communication among the elements of agent WS 148.

Processor 220 may include one or more processors, microprocessors, or processing logic that may interpret and execute instructions. Memory 230 may include a random access memory (RAM) or another type of dynamic storage device that may store information and instructions for execution by processor 220. Memory 230 may also include a read only memory (ROM) device or another type of static storage device that may store static information and instructions for use by processor 220. Memory 230 may further include a solid state drive (SDD). Memory 230 may also include a magnetic and/or optical recording medium (e.g., a hard disk) and its corresponding drive.

Input device 240 may include a mechanism that permits a user to input information to agent WS 148, such as a keyboard, a keypad, a mouse, a pen, a microphone, a touch screen, voice recognition and/or biometric mechanisms, etc. Output device 250 may include a mechanism that outputs information to the user, including a display (e.g., a liquid crystal display (LCD), a printer, a speaker, etc.).

Communication interface 260 may include a transceiver that agent WS 148 (or call transfer device 160) may use to communicate with other devices (e.g., voice portal 142, ACD 146, call transfer device 160, etc.) via wired, wireless or optical mechanisms. Communication interface 260 may also include one or more radio frequency (RF) transmitters, receivers and/or transceivers and one or more antennas for transmitting and receiving RF data via network 180. Communication interface 260 may also include a modem or an Ethernet interface to a LAN or other mechanisms for communicating with elements in a network, such as network 170 or another network.

The exemplary configuration illustrated in FIG. 2 is provided for simplicity. It should be understood that agent WSs 148 or 158, call transfer device 160, etc., may include more or fewer devices than illustrated in FIG. 2. In an exemplary implementation, agent WS 148 (or call transfer device 160) may perform operations in response to processor 220 executing sequences of instructions contained in a computer-readable medium, such as memory 230. A computer-readable medium may be defined as a physical or logical memory device. The software instructions may be read into memory 230 from another computer-readable medium (e.g., a hard disk drive (HDD), SSD, etc.), or from another device via communication interface 260. Alternatively, hard-wired circuitry may be used in place of or in combination with software instructions to implement processes consistent with the implementations described herein. Thus, implementations described herein are not limited to any specific combination of hardware circuitry and software.

Figure 3:
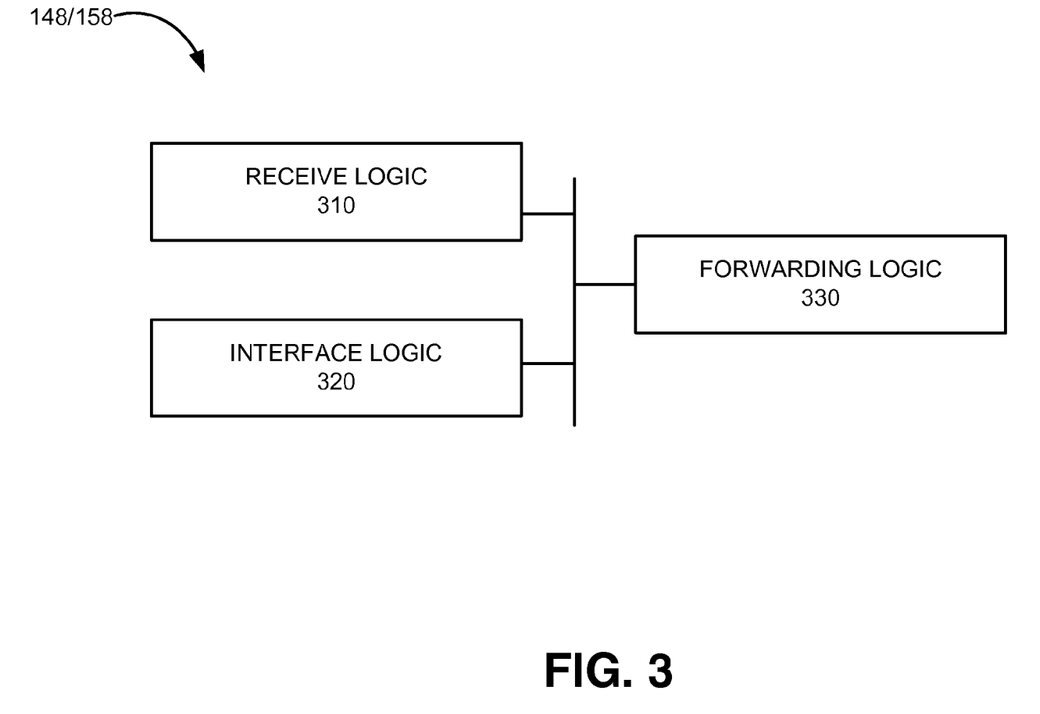
FIG. 3 illustrates an exemplary configuration of logic components implemented in one of the components of FIG. 1.

FIG. 3 is a functional block diagram of agent WS 148 according to an exemplary implementation. Agent WS 158 may be configured in a similar manner. The logical blocks illustrated in FIG. 3 may be implemented in software, hardware, or a combination of hardware and software. For example, some or all of the logical blocks illustrated in FIG. 3 may be implemented by processor 220 executing instructions stored in memory 230. In one implementation, the logical blocks illustrated in FIG. 3 are implemented in agent WS 148. It should be understood that the logical blocks illustrated in FIG. 3 may be located externally from agent WS 148 in other implementations.

Referring to FIG. 3, agent WS 148 may include receive logic 310, interface logic 320 and forwarding logic 330. Receive logic 310 may include a front end that receives calls from callers, such as a caller at user device 110. The calls may be forwarded by voice portal 142 or ACD 146. Voice portal 142 or receive logic 310 may determine the telephone number associated with an incoming call. For example, voice portal 142 may include an automatic number identification (ANI) system that determines the telephone number associated with an incoming call. In some implementations, voice portal 142 may also include logic to identify an address, such as an IP address, associated with an incoming call made from a computer device. In addition, in some implementations, IVR unit 144 may interact with the caller to attempt to identify a reason for the call. In an exemplary implementation, voice portal 142 may forward the identified information with the call to agent WS 148. For example, the telephone number, IP address and/or reason for the call may be provided with the call (e.g., in a SIP header of the call) to receive logic 310 when agent WS 148 receives the call.

After the call is received by receive logic 310, interface logic 320 may display various information to the agent via output device 250 (e.g., an LCD screen) of agent WS 148. For example, interface logic 320 may identify information in the forwarded call, such as the name of the caller, the telephone number of the caller, a reason for the call, etc., and output the information for display to the agent. The identified information may be included in a header, such as a SIP header, of the forwarded call. The agent at WS 148 may further interact with the caller to identify more detailed information regarding the nature of the call. In situations in which the agent is unable to handle the call, interface logic 320 may provide a graphical user interface (GUI) to the agent via output device 250 that facilitates identifying another call center that can handle the call and to which the call should be forwarded.

For example, if the agent at agent WS 148 determines that he/she (and call center 140) is not the appropriate entity to service the call, the agent may access a drop down menu/box provided by interface logic 320 via output device 250 (e.g., the agent's LCD or other display). The drop down menu may be labeled "transfer call" or something similar, and may include a number of selections associated with the reasons for the call. For example, one of the drop down selections may be "billing question for Internet service". Another selection may be "order new TV package". The agent may select the appropriate item via the drop down menu. By selecting an item/issue identified via the drop down menu, interface logic 320 may simplify the agent's task with respect to identifying a reason for forwarding a call. In other instances, the drop down menu may allow the agent to enter information regarding a reason for the transfer.

In each case, after an item/issue is selected, or the agent enters a reason for the transfer, interface logic 320 may automatically append information to a communication to be forwarded to an appropriate network device that will receive the call and make a determination as to where to transfer the call. For example, interface logic 320 may append information corresponding to the selected item/reason for the transfer to a SIP message (e.g., to the SIP header) that will be forwarded to an appropriate network device (e.g., call transfer device 160) that will transfer the call to the appropriate call center.

Forwarding logic 330 may receive the information from interface logic 320 and forward the call/communication from agent WS 148 to other components in system 100. For example, forwarding logic 330 may receive information from interface logic 320 identifying a reason for transferring a call and forward a SIP-based call/communication to another device in network 100. In an exemplary implementation, forwarding logic 330 may be programmed to forward calls not able to be handled within call center 140 to call transfer device 160. In this implementation, call transfer device 160 may act as an intelligent engine that can be used to identify information in a portion of a forwarded communication, and use the identified information (e.g., caller identified information, such as name, address and/or telephone number, a reason for the initial call, etc.) to identify the appropriate call center to which the call will be forwarded, as described in more detail below.

Figure 4:
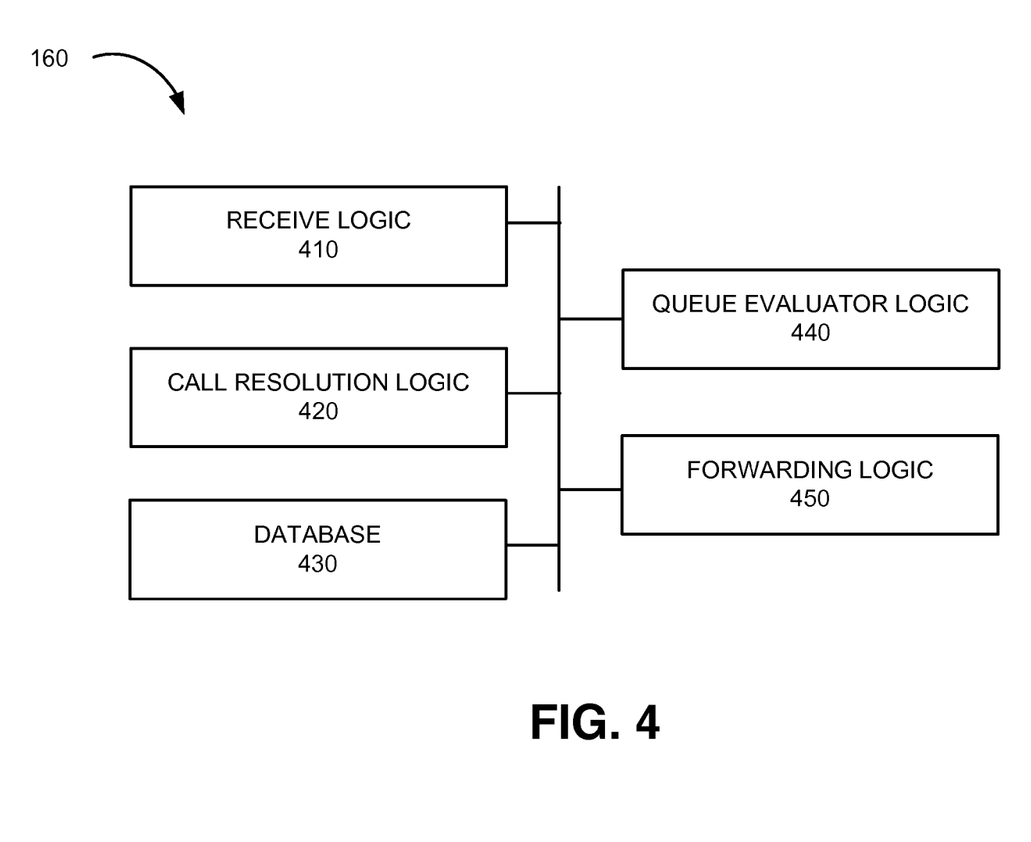
FIG. 4 illustrates an exemplary configuration of logic components implemented in another one of the components of FIG. 1.

FIG. 4 is a functional block diagram of call transfer device 160 according to an exemplary implementation. The logical blocks illustrated in FIG. 4 may be implemented in software, hardware, or a combination of hardware and software. For example, some or all of the logical blocks illustrated in FIG. 4 may be implemented by processor 220 executing instructions stored in memory 230. In one implementation, the logical blocks illustrated in FIG. 4 are implemented outside of call center 140/150. It should be understood that the logical blocks illustrated in FIG. 4 may be located internally with respect to call center 140/150, such as within voice portal 142/152 or agent WS 148/158 in other implementations.

Referring to FIG. 4, call transfer device 160 may include receive logic 410, call resolution logic 420, database 430, queue evaluator logic 440 and forwarding logic 450. Receive logic 410 may include a front end that receives calls forwarded from call center 140 or call center 150 (e.g., via agent WSs 148 or 158) associated with calls that cannot be serviced by the receiving call center. For example, receive logic 410 may receive a communication, such as a SIP communication, forwarded from agent WS 148. Receive logic 410 may forward the call to call resolution logic 420.

Call resolution logic 420 may extract information from the call, such as SIP header information, and determine where to transfer the call. For example, call resolution logic 420 may access database 430 to identify an appropriate call center to which the call should be forwarded. As an example, call resolution logic 420 may use information included in the SIP header of the call and identify an appropriate call center to which to forward the call using database 430.

Figure 5:
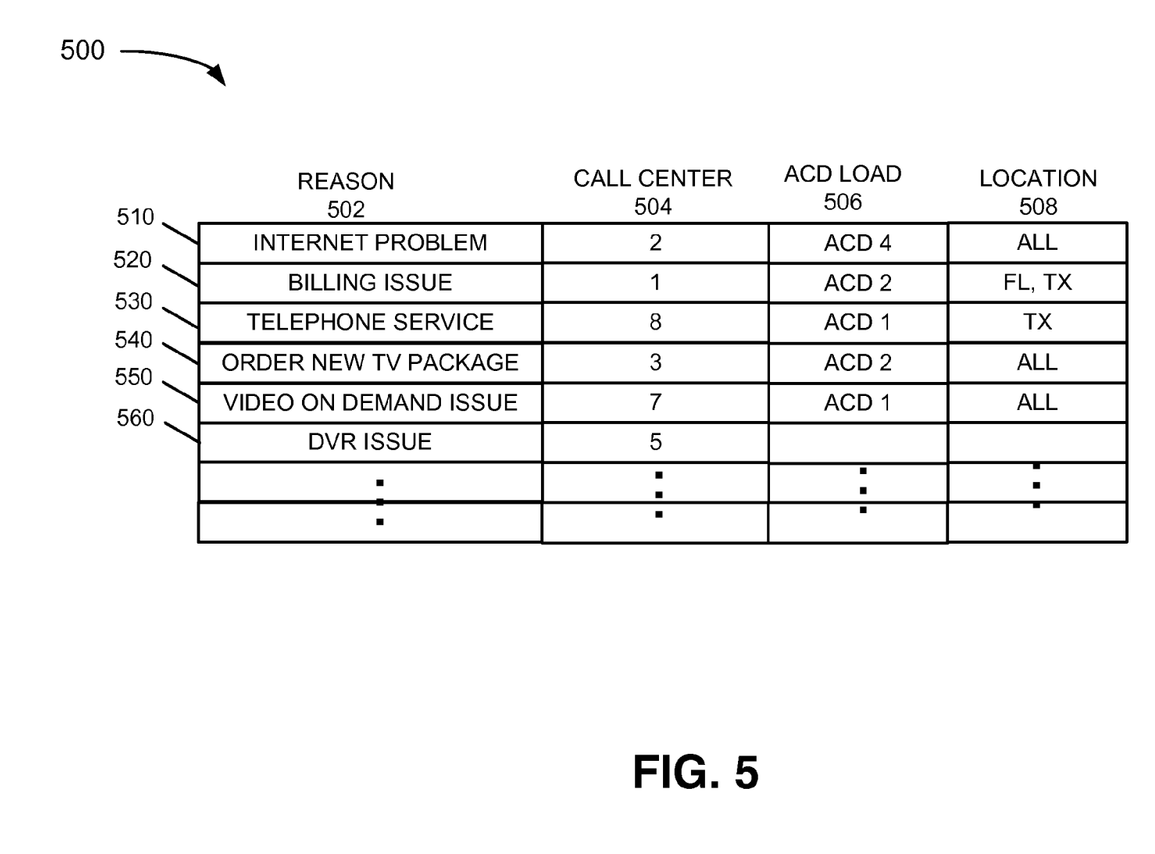
FIG. 5 is a diagram illustrating an exemplary table stored in one of the components illustrated in FIG. 4.

Database 430, as described above, may store information associated with identifying an appropriate call center to handle customer calls. For example, FIG. 5 illustrates an exemplary database 500 (also referred to herein as table 500) stored in database 430. Referring to FIG. 5, table 500 may include a reason field 502, a call center field 504, and ACD load field 506 and a location field 508. Reason field 502 may store information corresponding to a reason for which a call was transferred, such as various issues with services provided by an entity associated with call centers 140, 150 and other call centers. These reasons/issue may include Internet problem, billing issue, telephone service, etc. The information stored in reason field 502 may correspond to the items provided by interface logic 320 via a drop down menu discussed above. Field 502 illustrated in FIG. 5 shows text descriptions of reasons relating to a call. However, it should be understood that other types of alphanumeric identifiers may be stored in field 502. That is, a code for each reason for a call may be appended to the forwarded call received by call transfer device 160. These codes may correspond to reasons for the transferred call and may be stored in reason field 502.

Call center field 504 may store a call center identifier associated with handling the problem/issue in the corresponding entry in field 502. For example, field 502 in entry 510 indicates "Internet problem" and field 504 in entry 510 indicates that call center 2 is the appropriate call center that handles inquiries regarding a caller/customer's Internet problems. Call resolution logic 420 may access table 500, identify the problem based on the received information and identify the appropriate call center to handle the call.

In an exemplary implementation, database 500 may include an ACD load field 506. ACD load field 506 may store information identifying an ACD at the call center identified in field 504 as having a lightest call load and/or shortest queue time. For example, call transfer device 160 may receive real-time or near real-time information from call centers 140 and 150 indicating loading information on ACDs in call centers 140 and 150. This information may be used by queue evaluator logic 440 to identify an appropriate ACD to which to forward a call.

In an exemplary implementation, database 500 may also include location field 508. Location field 508 may be used in implementations in which the caller's location is relevant with respect to identifying a call center to service a particular call. For example, in some instances, rules or regulations associated with servicing a call may require that the servicing call center be located in a same jurisdiction as the caller. In such instances, location field 508 may indicate that calls from particular jurisdictions must be handled by a call center and/or call center agent in that area. For example, field 508 in entry 520 may indicate that Florida and Texas have rules relating to handling calls associated with billing problems. In such instances, call resolution logic 420 may take this information into account when identifying a forwarding call center and/or call center agent location.

Queue evaluator logic 440 may be used in some implementations to identify an ACD having a shortest queue time. For example, after call resolution logic 420 identifies an appropriate call center, call resolution logic 420 may also identify an appropriate ACD within the identified call center. For example, as described above, queue evaluator logic 440 may receive information from call centers 140 and 150 regarding current load conditions and/or queue times for each of the ACDs in these call centers. Queue evaluator logic 440 may use this information to identify an ACD at each call center (that includes multiple ACDs) that has a lowest queue time. Queue evaluator logic 440 may store this information in field 506. For example, ACD load field 506 in entry 540 in table 500 indicates that ACD 2 in call center 3 has the lowest queue time in call center 3. Call resolution logic 420 may append the identified ACD information to a call to be forwarded, as described in more detail below.

Forwarding logic 450 may forward a call to the appropriate call center and/or appropriate ACD within a call center. For example, forwarding logic 450 may forward a SIP call to the appropriate call center and ACD based on information provided by call resolution logic 420, as describe in more detail below.

Figure 6A:
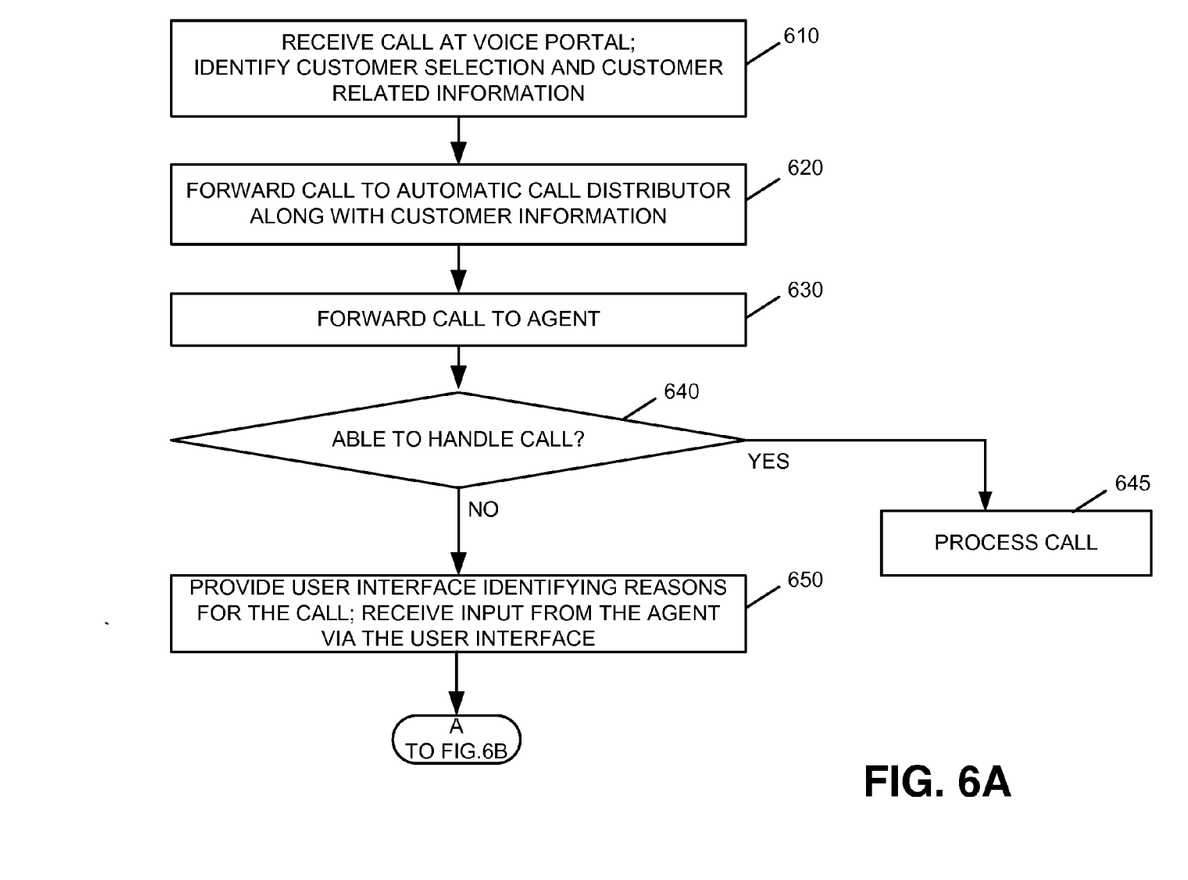
FIGS. 6A and 6B are flow diagrams illustrating exemplary processing associated with the components of FIG. 1.
Figure 6B:
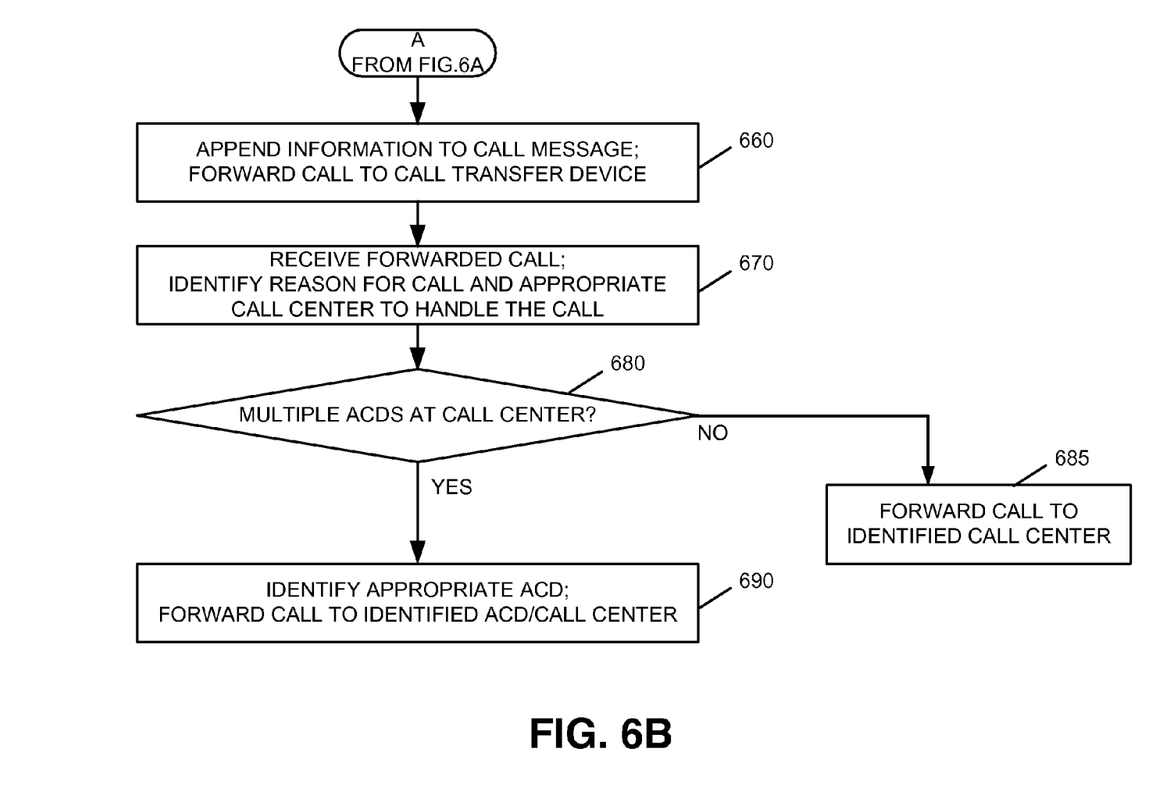

FIGS. 6A and 6B are exemplary flow diagrams illustrating processing associated with components in network 100. Processing may begin with a caller establishing communications with voice portal 142. For example, a caller (also referred herein as a customer) at user device 110 may call a telephone number associated with voice portal 142 or enter an Internet address associated with voice portal 142. In each case, voice portal 142 may receive the call (act 610).

Voice portal 142 may provide an automated greeting to the caller at user device 110. Voice portal 142 may also provide a menu of options to determine the reason or nature of the call and audibly request that the caller voice or input a selection via a keypad. Voice portal 142 may identify the caller's selection (act 610). For example, speech recognition software included in voice portal 142 may identify the caller's voice selection or identify a keypad input. In this example, assume that voice portal 142 is associated with providing services to customers, such as telephone service for the caller at user device 110. Further assume that the caller has input a selection to speak to a customer agent about his/her telephone service.

Voice portal 142, as described above, may perform an ANI lookup to identify the telephone number. Voice portal 142 may also use the telephone number as an index to a database to determine a name and/or address associated with the caller's telephone number. Voice portal 142 may then transfer the call to ACD 146 along with the identified customer information, such as the customer's name, address, telephone number and/or reason for the call (act 620). This customer-related information will eventually be forwarded to one of agent WSs 148, where the agent's screen will display the customer information (e.g., the caller's name and/or address, telephone number, reason for the call, etc.) as a screen pop. That is, the customer-related information may be automatically displayed via output device 250 (e.g., an LCD screen) of agent WS 148 when the call is transferred to agent WS 148.

ACD 146 may queue the call. For example, assume that all of the agents associated with WSs 148 are busy helping customers. In this case, ACD 146 may queue the call. Assume that the call has reached the top of the queue and is forwarded to agent WS 148-1 (act 630). When the call is answered by the agent at WS 148-1, the information associated with the call may be provided or popped to the agent on a display screen associated with agent WS 148-1 (act 630). Continuing with the example above, the agent's screen at WS 148-1 may automatically display "Mr. Smith is calling regarding his telephone service". The agent at WS 148-1 may authenticate the caller and also interact with the caller to confirm the initial reason for the call. The agent may then determine whether he/she is able to handle the call (act 640).

In this case, assume that call center 140 is only designed to handle calls with respect to troubleshooting problems with the caller's telephone service. If the call is associated with troubleshooting the caller's telephone service and the agent is able to handle the call (act 640—yes), the agent may process the call (act 645). In this case, assume that the caller has called because he/she has a billing question regarding his/her telephone service. The agent at WS 148-1 may determine that he/she cannot handle the call (act 640—no). That is, the agent at agent WS 148-1 is not able to handle billing related inquiries.

In this case, the agent at WS 148-1 may access the drop down menu provided by interface logic 320 that lists a number of items/selections associated with possible reasons for the call (act 650). The agent may select the appropriate item/reason in the drop down menu and interface logic 320 may receive the selection from the agent (act 650). For example, interface logic 320 may provide a drop down menu labeled "transfer" or something similar on output device 250 at agent WS 148-1. The agent may click on the drop down box and select the item identifying the reason for the call. In this example, assume that the drop down box includes a selection for "telephone billing issue." Interface logic 320 may receive the input.

Interface logic 320 may identify the input and append information identifying the reason for the call (i.e., telephone billing issue in this example) to a communication/call that is to be forwarded to call transfer device 160 (FIG. 6B, act 660). For example, interface logic 320 may append information in a SIP header of a SIP call message that indicates the reason for the call (e.g., billing issue). The header of the SIP message may also include other information about the caller, such as the caller's name, address and/or telephone number. In some implementations, interface logic 320 may append information identifying the reason for the call with the previously identified caller specific information (e.g., name, address and/or telephone number) to the SIP header of the call message. Interface logic 320 may then forward the SIP communication to forwarding logic 330.

Forwarding logic 330 may receive the SIP communication and automatically append a telephone number or a SIP address in the SIP header that corresponds to call transfer device 160. For example, forwarding logic 330 may access the telephone number and/or IP address of call transfer device 160 stored in memory (e.g., memory 230) and may be programmed to automatically forward calls to be transferred to call transfer device 160. In one implementation, forwarding logic 330 may insert the telephone number or IP address of call transfer device 160 in a SIP header of the SIP-based call and forward the call to call transfer device 160 (act 660). In this manner, calls that must be forwarded to another call center are forwarded to call transfer device 160.

Call transfer device 160 may receive the forwarded communication (act 670). Call transfer device 160 may identify information included in the communication, such as information in the SIP header. For example, call resolution logic 420 may access the SIP header information to extract information identifying a reason for the transfer (act 670). Call resolution logic 670 may also identify other information associated with the call, such as the caller's location (e.g., address or state of residence). Call resolution logic 420 may then access table 500 to then identify an appropriate call center to which to forward the call (act 670).

For example, call resolution logic 420 may access table 500 to identify the call center handling telephone billing issues. Referring to table 500, entry 520 includes information in reason field 502 that identifies billing issue. Field 502 in entry 520 indicates that call center 1 is the appropriate call center to handle billing issues. In this example, assume that call center 1 corresponds to call center 150 in FIG. 1. Call resolution logic 420 may identify call center 150 as the appropriate call center to handle the customer's call. In this case, call resolution logic 420 may append a telephone number or SIP address in the SIP header of the call indicating that the SIP call should be forwarded to call center 150 (e.g., voice portal 152).

As described above with respect to FIG. 4, in some implementations, queue evaluator logic 440 may receive real-time or near real-time call volume information from various ACDs in the call centers. Queue evaluator logic 440 may store information identifying a particular ACD in ACD load field 506 to which to forward the call. Continuing with this example, call resolution logic 420 may determine whether multiple ACDs exist in call center 1 (act 680). If not (act 680—no), call resolution logic 420 may forward the call to the identified call center (i.e., call center 150 in this example) (act 685). For example, entry 560 in table 500 indicates that the call center associated with handling digital video recorder (DVR) issues has only a single ACD, as evidenced by no ACD identifier in field 506.

If, however, the identified call center has multiple ACDs (act 680—yes), call resolution logic 420 may identify the ACD having a lightest load and/or shortest queue time (act 690). For example, call resolution logic 420 may identify the ACD stored in field 506. In this example, ACD load field 506 in entry 520 indicates that ACD 2 has the lightest load or shortest queue time.

Call resolution logic 420 may append information to the call that identifies the appropriate ACD and forward the call to the identified ACD at the identified call center (act 690). For example, call resolution logic 420 may append the information identifying ACD 2 to a SIP header of the SIP call. The SIP header of the call may also include the previously obtained caller specific information, such as the caller's name, address and/or telephone number. Forwarding logic 450 may then forward the call to call center 150 and ACD 2 will receive the call. In this manner, a call may be forwarded such that the call will be processed quickly by the call center to which the call was transferred. The receiving call center and/or call center agent may also receive caller specific information with the call, such as the information indicating the caller's name, address and/or telephone number, etc. As described above, this information may be popped to the screen of the agent WS that services the call. This may allow the agent at the call center to which the call is forwarded to quickly service the call.

As also described above, in instances where location field 508 indicates that a particular jurisdiction has rules with respect to a call center/call center agent servicing a call, call resolution logic 420 may identify a call center and/or call center agent satisfying the particular rule identified in location field 508. For example, if billing issue inquiries from callers in Florida must be handled by a call center agent in Florida, call resolution logic 420 may ensure that the call center and/or ACD to which the call is forwarded to is located in the appropriate jurisdiction (i.e., Florida in this example).

Implementations described herein provide for transferring calls from an initial receiving call center to the appropriate call center. The call center agent initially handling the call is provided with a simple interface to select information associated with forwarding the call and does not have to spend a significant amount of time attempting to identify a call center to which to forward the call. For example, the agent does not have to keep track of telephone numbers of other call centers associated with handling a variety of issues. This allows the agent to efficiently process the call when the call is not able to be handled by the receiving call center.

The foregoing description of exemplary implementations provides illustration and description, but is not intended to be exhaustive or to limit the embodiments to the precise form disclosed. Modifications and variations are possible in light of the above teachings or may be acquired from practice of the embodiments.

For example, features have been described above with respect to agent WSs 148/158 forwarding calls to call transfer device 160. In other implementations, a single device, another network device or more than two devices may be involved in performing the tasks described above with respect to transferring a call. For example, in some implementations, agent WSs 148/158 may generate the forwarding information and transfer the call directly to the appropriate call center and/or ACD at the appropriate call center.

In addition, in some implementations, ACDs (e.g., ACD 146 and/or 156) may be located in the same location as call transfer device 160. That is, a switching center may include one or more ADCs and call transfer device 160. The switching center may then forward calls to call centers (e.g., call centers 140 and 150) and receive calls from the call centers that are to be transferred to other call centers, as described above.

In addition, features have been described above with respect to providing a graphical user interface at an agent workstation that allows the agent to simply select a reason or purpose for the call. In other implementations, agent WSs 148/158 may include speech recognition hardware/software that receives voice responses from the caller identifying the reason or purpose for the call. In some implementations, the speech recognition hardware/software may identify the voice selection and automatically append the information or a code corresponding to the identified information to a communication/call for forwarding to call transfer device 160. That is, the agent does not have to select the item regarding the reason/purpose for the call.

In addition, features have been mainly described above with respect to a service provider that operates call centers and provides services, such as telephone, cable TV and Internet services. It should be understood that call centers 140 and 150 may be associated with any type of merchant or service provider that may use a call center to answer calls from customers.

In addition, implementations described above refer to receiving voice calls. In other implementations, other types of communications, such as text-based messages, from customers may be handled in a similar manner. For example, a customer at user device 110 may access call center 140 and identify a reason for the call. Agent WS 148 and/or voice portal 142 may forward the call to call transfer device 160 based on the received information when the call cannot be handled by call center 140.

In addition, while series of acts have been described with respect to FIGS. 6A and 6B, respectively, the order of the acts may be varied in other implementations. Moreover, non-dependent acts or signal flows may be implemented in parallel.

It will be apparent that various features described above may be implemented in many different forms of software, firmware, and hardware in the implementations illustrated in the figures. The actual software code or specialized control hardware used to implement the various features is not limiting. Thus, the operation and behavior of the features were described without reference to the specific software code—it being understood that one of ordinary skill in the art would be able to design software and control hardware to implement the various features based on the description herein.

Further, certain portions of the invention may be implemented as "logic" that performs one or more functions. This logic may include hardware, such as one or more processors, microprocessors, application specific integrated circuits, field programmable gate arrays or other processing logic, software, or a combination of hardware and software.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A method, comprising:
  receiving, at a first call center, a call from a caller;
  identifying first information associated with the caller based on the caller's telephone number or a network address associated with the caller;
  forwarding the call to an agent workstation;
  determining, at the agent workstation, that the call must be transferred;
  providing, at the agent workstation, a graphical user interface including a plurality of items associated with possible reasons for the call;
  receiving, via the graphical user interface and from an agent at the agent workstation, input identifying one of the items associated with a reason for the call;
  appending information to the call based on the received input, wherein the appending comprises appending information identifying the reason for the call in a header of a session initiation protocol (SIP) message;
  forwarding the call with the appended information to a call transfer device associated with a plurality of call centers;
  identifying, by the call transfer device, a second call center to which to forward the call;
  identifying, by the call transfer device, an automatic call distributor (ACD) from among a plurality of ACDs at the second call center, the identified ACD having a shortest queue time or lightest call load of the plurality of ACDs at the second call center; and
  forwarding the call to the second call center.

2. The method of claim 1, wherein the identifying a second call center comprises:
  accessing the appended information, and
  identifying the second call center based on the appended information.

3. The method of claim 1, wherein the forwarding the call to the second call center comprises:
  forwarding the call to the identified ACD at the second call center.

4. The method of claim 1, wherein the identifying a second call center comprises:

accessing a database that stores information identifying types of calls handled by each of a plurality of call centers, determining that the appended information matches information associated with the second call center, and selecting the second call center based on the determining.

5. The method of claim 1, wherein the SIP message comprises a second SIP message and receiving a call comprises:

receiving the call at a first voice portal via a first session initiation protocol (SIP) message, and wherein the forwarding the call with the appended information to a call transfer device comprises:

forwarding the call to the call transfer device via the second SIP message.

6. The method of claim 5, wherein the appending comprises:

appending the information in the header of the second SIP message.

7. The method of claim 1, wherein the forwarding the call to the call transfer device comprises:

inserting a telephone number or Internet protocol (IP) address into the SIP message, the telephone number or IP address identifying the call transfer device.

8. A system, comprising:

a memory configured to store information associated with a plurality of call centers, wherein the information identifies at least one topic or subject matter associated with calls handled by each of the plurality of call centers; and a first device configured to:

receive a call forwarded from a first one of the plurality of call centers via a session initiation protocol (SIP) message, identify information included in a header of the SIP message, the information in the header of the SIP message identifying a reason or purpose for the call, access the memory and identify one of the plurality of call centers handling calls matching the reason or purpose for the call, identify an automatic call distributor (ACD) from among a plurality of ACDs at the identified call center, the identified ACD having a shortest queue time or lightest call load of the plurality of ACDs, and automatically forward the call to the identified call center.

9. The system of claim 8, wherein when forwarding the call to the identified call center, the first device is configured to:

forward the call to the identified ACD at the identified call center.

10. The system of claim 8, wherein the first device is further configured to:

determine that information included in the SIP header matches information stored in the memory that is associated with a second one of the plurality of call centers, and select the second call center based on the determining.

11. The system of claim 8, wherein the first device is further configured to:

forward the call to the identified call center via a second SIP message.

12. The system of claim 8, further comprising:

a second device associated with the first call center, wherein the second device is configured to:

receive the call from a caller, determine, at the second device, that the call must be transferred, provide, at the second device, a user interface including a plurality of items associated with possible reasons for the call, receive, via the user interface, input from an agent selecting one of the items associated with the reason for the call, append information to the call based on the selected item, and forward the call with the appended information to the first device.

13. The system of claim 12, wherein the call is a session initiation protocol (SIP) based call, and when appending information, the second device is configured to:

append the information in the header of the SIP message.

14. A method, comprising:

receiving, at a first call center, a call from a caller;

identifying, at the first call center, at least one of a location or name associated with the caller;

forwarding the call to an agent workstation;

determining, at the agent workstation, that the call must be transferred;

providing, at the agent workstation, a graphical user interface identifying a plurality of items associated with possible reasons for the call;

receiving, via the graphical user interface and from the agent at the agent workstation, input selecting one of the plurality of items corresponding to a reason for the call;

appending information to the call based on the received input, wherein the appending comprises appending information identifying the reason for the call in a header of a message;

forwarding the call with the appended information to a network device associated with a plurality of call centers;

identifying, by the network device, a second call center to which to forward the call based on the appended information; and identifying an automatic call distributor (ACD) from among a plurality of ACDs at the second call center, the identified ACD having a shortest queue time or lightest call load of the plurality of ACDs.

15. The method of claim 14, wherein the appending further comprises:

appending the information identifying the reason for the call using session initiation protocol (SIP) signaling or H.323 signaling.

16. The method of claim 15, further comprising:

attaching information identifying at least one of the location or name associated with the caller to the call, wherein the forwarded call includes the attached information;

identifying, by the network device, the second call center to which to forward the call based on the attached information; and forwarding the call to the second call center.

* * * * *